(12) United States Patent
Goto

(10) Patent No.: US 10,990,011 B2
(45) Date of Patent: Apr. 27, 2021

(54) CURABLE COMPOSITION FOR IMPRINTING, CURED PRODUCT, PATTERN FORMING METHOD, AND LITHOGRAPHY METHOD

(71) Applicant: FUJIFILM Corporation, Tokyo (JP)

(72) Inventor: Yuichiro Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/261,884

(22) Filed: Jan. 30, 2019

(65) Prior Publication Data
US 2019/0163059 A1 May 30, 2019

Related U.S. Application Data

(63) Continuation of application No. PCT/JP2017/027197, filed on Jul. 27, 2017.

(30) Foreign Application Priority Data

Aug. 1, 2016 (JP) .............................. JP2016-151554

(51) Int. Cl.
| | | |
|---|---|---|
| G03F 7/00 | (2006.01) | |
| C08F 220/20 | (2006.01) | |
| G03F 7/031 | (2006.01) | |
| G03F 7/075 | (2006.01) | |
| C08F 2/50 | (2006.01) | |
| G03F 7/027 | (2006.01) | |
| H01L 21/027 | (2006.01) | |
| B29C 59/02 | (2006.01) | |
| C08F 222/10 | (2006.01) | |
| C07F 7/18 | (2006.01) | |
| C07F 9/53 | (2006.01) | |

(52) U.S. Cl.
CPC ............ *G03F 7/031* (2013.01); *B29C 59/022* (2013.01); *B29C 59/026* (2013.01); *C08F 2/50* (2013.01); *C08F 220/20* (2013.01); *C08F 222/1006* (2013.01); *G03F 7/0002* (2013.01); *G03F 7/027* (2013.01); *G03F 7/0755* (2013.01); *H01L 21/027* (2013.01); *H01L 21/0271* (2013.01); *B29C 2059/023* (2013.01); *C07F 7/1804* (2013.01); *C07F 9/5337* (2013.01); *C08F 222/102* (2020.02); *C08F 222/1025* (2020.02); *C08F 2800/20* (2013.01)

(58) Field of Classification Search
CPC . H01L 21/0217; H01L 21/027; G03F 7/0755; G03F 7/031; G03F 7/027; G03F 7/0002; C08F 2800/20; C08F 222/1025; C08F 222/102; C08F 222/1006; C08F 222/10; C08F 222/20; C08F 222/18; C08F 2/50; C07F 9/5337; C07F 7/1804; B29C 2059/023; B29C 59/026; B29C 59/022; B29C 59/02
See application file for complete search history.

(56) References Cited

U.S. PATENT DOCUMENTS

| | | |
|---|---|---|
| 2012/0231234 A1 | 9/2012 | Kodama |
| 2014/0374884 A1 | 12/2014 | Kitagawa et al. |
| 2016/0215074 A1 | 7/2016 | Honma et al. |
| 2017/0183437 A1 | 6/2017 | Kato et al. |
| 2017/0190820 A1* | 7/2017 | Kitagawa .................. C08F 2/48 |

FOREIGN PATENT DOCUMENTS

| | | |
|---|---|---|
| JP | 2009-73078 A | 4/2009 |
| JP | 2011-057565 A | 3/2011 |
| JP | 2011-060818 A | 3/2011 |
| JP | 2011-251508 A | 12/2011 |
| JP | 2012-186356 A | 9/2012 |

(Continued)

OTHER PUBLICATIONS

Office Action dated Jan. 9, 2020 in Korean Application No. 10-2019-7003066.
International Preliminary Report on Patentability with a Translation of Written Opinion issued from the International Bureau in counterpart International Application No. PCT/JP2017/027197, dated Feb. 5, 2019.
Written Opinion issued by the International Bureau in corresponding International Application No PCT/JP2017/027197, dated Oct. 24, 2017.
International Search Report for PCT/JP2017/027197 dated Oct. 24, 2017.
Office Action dated Oct. 8, 2019, from the Japanese Patent Office in counterpart Japanese Application No. 2018-531858.

(Continued)

*Primary Examiner* — Sanza L. McClendon
(74) *Attorney, Agent, or Firm* — Sughrue Mion, PLLC

(57) ABSTRACT

Provided are a curable composition for imprinting and a cured product, a pattern forming method, and a lithography method in which the curable composition for imprinting is used, the curable composition having excellent resolution ability, filling properties into a mold, and releasability from a mold in a case where a fine pattern having a size of 20 nm or less is prepared. The curable composition for imprinting includes: a monofunctional polymerizable compound; a bifunctional polymerizable compound; and a photopolymerization initiator, in which a content of the monofunctional polymerizable compound is 5 to 30 mass % with respect to a content of all the polymerizable compounds, a content of the bifunctional polymerizable compound is 70 mass % or higher with respect to a content of all the polymerizable compounds, at least one bifunctional polymerizable compound is a bifunctional polymerizable compound in which the number of atoms linking two polymerizable groups to each other is 2 or less, and a content of a bifunctional polymerizable compound that does not include an alicyclic structure and an aromatic ring structure and in which the number of atoms linking two polymerizable groups to each other is 3 or more is 30 mass % or lower with respect to the content of all the polymerizable compounds.

18 Claims, No Drawings

(56) References Cited

FOREIGN PATENT DOCUMENTS

| | | |
|---|---|---|
| JP | 2013-170227 A | 9/2013 |
| JP | 2013-189537 A | 9/2013 |
| JP | 2015-130535 A | 7/2015 |
| JP | 2015-179807 A | 10/2015 |
| JP | 2016-029138 A | 3/2016 |
| JP | 2016-030829 A | 3/2016 |
| KR | 10-2011-0026398 A | 3/2011 |

OTHER PUBLICATIONS

Office Action dated Jan. 18, 2021, from the Taiwanese Intellectual Property Office in Taiwanese application No. 106124987.

* cited by examiner

CURABLE COMPOSITION FOR IMPRINTING, CURED PRODUCT, PATTERN FORMING METHOD, AND LITHOGRAPHY METHOD

CROSS-REFERENCE TO RELATED APPLICATIONS

This application is a Continuation of PCT International Application No. PCT/JP2017/027197 filed on Jul. 27, 2017, which claims priority under 35 U.S.C. § 119(a) to Japanese Patent Application No. 2016-151554 filed on Aug. 1, 2016. Each of the above application(s) is hereby expressly incorporated by reference, in its entirety, into the present application.

BACKGROUND OF THE INVENTION

1. Field of the Invention

The present invention relates to a curable composition for imprinting. In addition, the present invention also relates to a cured product, a pattern forming method, and a lithography method in which the curable composition for imprinting is used.

2. Description of the Related Art

An imprint method is a technique of transferring a fine pattern to a material by pressing a mold (in general, referred to as "mold" or "stamper") on which a pattern is formed against the material. By using the imprint method, a fine pattern can be prepared easily and accurately. Therefore, recently, the application of the imprint method to various fields has been expected. In particular, a nanoimprint technique of forming a fine pattern on a nano-order level has attracted attention.

As the imprint method, methods called a thermal imprint method and a photoimprint method have been proposed depending on a transfer method. In the thermal imprint method, a fine pattern is formed by pressing a mold against a thermoplastic resin heated to a glass transition temperature (hereinafter, also referred to as "Tg") or higher, cooling the thermoplastic resin, and releasing the mold. In this method, various materials can be selected, but there are problems in that a high pressure is required during pressing and it is difficult to form a fine pattern due to thermal shrinkage or the like.

On the other hand, in the photoimprint method, a curable composition for imprinting is photocured in a state where a mold is pressed against the curable composition for imprinting, and then the mold is released. Since this photoimprint method is an imprint method for an uncured product, a fine pattern can be simply formed without requiring high-pressure and high-temperature heating.

In the photoimprint method, a curable composition for imprinting is applied to a substrate (on which an adhesion treatment is optionally performed), and a mold formed of a light-transmitting material such as quartz is pressed against the curable composition for imprinting. In a case where the mold is pressed against the curable composition for imprinting, the curable composition for imprinting is cured by light irradiation, and then the mold is released. As a result, a cured product to which a desired pattern is transferred is prepared.

Examples of a method of applying the curable composition for imprinting to the substrate include a spin coating method and an ink jet method. In particular, the ink jet method is an application method that has recently attracted attention from the viewpoint of a small loss of the curable composition for imprinting.

In addition, a method of performing microfabrication using a transferred imprint pattern as a mask is called nanoimprint lithography (NIL), and has been developing as the next-generation lithography technique in place of the current ArF immersion process. Therefore, as in the case of an extreme ultraviolet (EUV) resist, a curable composition for imprinting used in NIL is required to have resolution ability of an ultrafine pattern having a size of 20 nm or less and high etching resistance as a mask during microfabrication of an object to be processed. Further, since throughput (productivity) is also emphasized during mass-production, nanoimprint suitability such as pattern filling properties (filling time reduction) and mold releasability (mold releasing time reduction) is also required.

As patent documents that disclose curable compositions for imprinting having excellent etching resistance, filling properties, and releasability, JP2015-179807A, JP2016-029138A, JP2016-030829A, JP2013-189537A, JP2011-251508A, and JP2015-130535A are known. In JP2015-179807A, JP2016-029138A, and JP2016-030829A, phenyl ethylene glycol diacrylate is used as an acrylate monomer having high etching resistance. In addition, in JP2013-189537A, a polyfunctional acrylate having at least one of an alicyclic structure or an aromatic ring structure is used. Further, in JP2011-251508A and JP2015-130535A, an acrylate monomer including silicon is used in order to improve etching resistance.

SUMMARY OF THE INVENTION

However, the present inventor conducted a thorough investigation on the above-described patent documents and found that, in a case where imprint lithography of a fine pattern having a size of 20 nm or less is performed using the curable composition for imprinting described in any one of the patent documents, it is difficult to perform microfabrication on an object to be processed. Specifically, it was found that, in a case where a fine pattern having a size of 20 nm or less is prepared, resolution ability, filling properties of a curable composition for imprinting into a mold, and releasability from a mold are poor. An object of the present invention is to solve the above-described problems and to provide a curable composition for imprinting having excellent resolution ability, filling properties, and releasability described above, and a cured product, a pattern forming method, and a lithography method in which the curable composition for imprinting is used.

The present inventors conducted an investigation under the above-described circumstances and found that the object can be achieved by fixing the content of a monofunctional polymerizable compound to a given value with respect to the content of all the polymerizable compounds and controlling the number of atoms linking two polymerizable groups of a bifunctional polymerizable compound to each other.

Specifically, the above-described problems can be solved using the following means <1> or <2> and preferably <3> to <21>.

<1> A curable composition for imprinting comprising:
a monofunctional polymerizable compound;
a bifunctional polymerizable compound; and
a photopolymerization initiator, in which a content of the monofunctional polymerizable compound is 5 to 30 mass % with respect to a content of all the polymerizable compounds included in the curable composition for imprinting, a content of the bifunctional polymerizable compound is 70 mass % or higher with respect to the content of all the polymerizable compounds included in the curable composition for imprinting, at least one bifunctional polymerizable compound is a bifunctional polymerizable compound in which the number of atoms linking two polymerizable groups to each other is 2 or less, and a content of a bifunctional polymerizable compound that does not include an alicyclic structure and an aromatic ring structure and in which the number of atoms linking two polymerizable groups to each other is 3 or more is 30 mass % or lower with respect to the content of all the polymerizable compounds included in the curable composition for imprinting.

<2> A curable composition for imprinting comprising:
a monofunctional polymerizable compound;
a bifunctional polymerizable compound; and
a photopolymerization initiator,
in which a content of the monofunctional polymerizable compound is 5 to 30 mass % with respect to a content of all the polymerizable compounds included in the curable composition for imprinting, a content of the bifunctional polymerizable compound is 70 mass % or higher with respect to the content of all the polymerizable compounds included in the curable composition for imprinting, at least one bifunctional polymerizable compound is a bifunctional polymerizable compound that includes two polymerizable groups having an ethylenically unsaturated bond and in which the number of atoms linking the ethylenically unsaturated bonds to each other is 6 or less, and a content of a bifunctional polymerizable compound that does not include an alicyclic structure and an aromatic ring structure and in which the number of atoms linking two polymerizable groups to each other is 3 or more is 30 mass % or lower with respect to the content of all the polymerizable compounds included in the curable composition for imprinting.

<3> The curable composition for imprinting according to <1> or <2>,
in which the polymerizable groups included in the bifunctional polymerizable compound are each independently a (meth)acryloyloxy group.

<4> The curable composition for imprinting according to any one of <1> to <3>,
in which the bifunctional polymerizable compound in which the number of atoms linking two polymerizable groups to each other is 2 or less and the bifunctional polymerizable compound that includes two polymerizable groups having an ethylenically unsaturated bond and in which the number of atoms linking the ethylenically unsaturated bonds to each other is 6 or less have a boiling point of 230° C. or higher at 101325 Pa <5> The curable composition for imprinting according to any one of <1> to <4>,
in which a content of the bifunctional polymerizable compound that does not include an alicyclic structure and an aromatic ring structure and in which the number of atoms linking two polymerizable groups to each other is 3 or more is 15 mass % or lower with respect to the content of all the polymerizable compounds included in the curable composition for imprinting.

<6> The curable composition for imprinting according to any one of <1> to <5>,
in which 40 mass % or higher of all the polymerizable compounds included in the curable composition for imprinting are formed of a bifunctional polymerizable compound that has at least one of an alicyclic structure or an aromatic ring structure.

<7> The curable composition for imprinting according to any one of <1> to <6>,
in which the bifunctional polymerizable compound that does not include an alicyclic structure and an aromatic ring structure and in which the number of atoms linking two polymerizable groups to each other is 3 or more has a viscosity of 50 mPa·s or lower at 25° C.

<8> The curable composition for imprinting according to any one of <1> to <7>,
in which the bifunctional polymerizable compound that does not include an alicyclic structure and an aromatic ring structure and in which the number of atoms linking two polymerizable groups to each other is 3 or more is a (meth)acrylate.

<9> The curable composition for imprinting according to any one of <1> to <8>,
in which a total content of the bifunctional polymerizable compound in which the number of atoms linking two polymerizable groups to each other is 2 or less and the bifunctional polymerizable compound that includes two polymerizable groups having an ethylenically unsaturated bond and in which the number of atoms linking the ethylenically unsaturated bonds to each other is 6 or less is 1 to 80 mass % with respect to the content of all the polymerizable compounds included in the curable composition for imprinting.

<10> The curable composition for imprinting according to any one of <1> to <9>,
in which the monofunctional polymerizable compound is a (meth)acrylate.

<11> The curable composition for imprinting according to any one of <1> to <10>,
in which an Ohnishi parameter of the curable composition for imprinting is 4.0 or lower.

<12> The curable composition for imprinting according to any one of <1> to <11>,
in which a viscosity of the curable composition for imprinting at 23° C. is 8 mPa·s or lower.

<13> The curable composition for imprinting according to any one of <1> to <12>,
in which at least one monofunctional polymerizable compound includes at least one group selected from the group consisting of:
a group that includes at least one of an alkyl chain or an alkenyl chain and at least one of an alicyclic structure or an aromatic ring structure and in which the total number of carbon atoms is 8 or more;
a group that includes an alkyl chain having 4 or more carbon atoms; and
a group that includes an alkenyl chain having 4 or more carbon atoms.

<14> The curable composition for imprinting according to <13>,
in which the alkyl chain and the alkenyl chain are each independently linear or branched.

<15> The curable composition for imprinting according to any one of <1> to <14>,
in which a content of a trifunctional or higher polymerizable compound is 3 mass % or lower with respect to the content of all the polymerizable compounds included in the curable composition for imprinting.

<16> The curable composition for imprinting according to any one of <1> to <15>, further comprising:

a release agent.

<17> A cured product which is formed by curing the curable composition for imprinting according to any one of <1> to <16>.

<18> The cured product according to <17>, which is provided on a silicon substrate.

<19> A pattern forming method comprising:

applying the curable composition for imprinting according to any one of <1> to <16> to a substrate or a mold; and irradiating the curable composition for imprinting with light in a state where the curable composition for imprinting is interposed between the mold and the substrate.

<20> The pattern forming method according to <19>, in which a size of the pattern is 20 nm or less. <21> A lithography method comprising:

performing etching by using a pattern which is obtained using the pattern forming method according to <19> or <20> as a mask.

According to the present invention, it is possible to provide a curable composition for imprinting and a cured product, a pattern forming method, and a lithography method in which the curable composition for imprinting is used, the curable composition having excellent resolution ability, filling properties into a mold, and releasability from a mold in a case where a fine pattern having a size of 20 nm or less is prepared.

DESCRIPTION OF THE PREFERRED EMBODIMENTS

Hereinafter, the details of the present invention will be described.

In this specification, numerical ranges represented by "to" include numerical values before and after "to" as lower limit values and upper limit values.

In this specification, "(meth)acrylate" denotes acrylate and methacrylate, "(meth)acryl" denotes acryl and methacryl, and "(meth)acryloyl" denotes acryloyl and methacryloyl. "(meth)acryloyloxy" denotes acryloyloxy and methacryloyloxy.

In this specification, "imprint" denotes preferably transfer of a pattern having a size of 1 nm to 10 mm and more preferably transfer of a pattern having a size of about 10 nm to 100 μm (nanoimprint).

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, "light" refers to not only light in ultraviolet, near ultraviolet, far-ultraviolet, visible, infrared wavelength ranges but also an electromagnetic wave and radiation. Examples of the radiation include a microwave, an electron beam, extreme ultraviolet (EUV) radiation, and an X-ray. In addition, laser light such as 248 nm excimer laser light, 193 nm excimer laser light, or 172 nm excimer laser light can also be used. As these light components, monochromatic light (single-wavelength light) having passed through an optical filter may also be used, or light (complex light) having a plurality of different wavelengths may also be used.

In this specification, a total solid content denotes the total mass of all the components of the composition excluding a solvent.

Unless specified otherwise, an atmospheric pressure during boiling point measurement in the present invention denotes 101325 Pa (1 atm).

In this specification, the term "step" denotes not only an individual step but also a step which is not clearly distinguishable from another step as long as an effect expected from the step can be achieved.

In this specification, unless specified otherwise, "weight-average molecular weight (Mw)" and "number-average molecular weight (Mn)" are defined as values in terms of polystyrene obtained by gel permeation chromatography (GPC). In this specification, the weight-average molecular weight (Mw) and the number-average molecular weight (Mn) can be obtained, for example, by using HLC-8220GPC (manufactured by Tosoh Corporation) and using a guard column HZ-L, TSK gel Super HZM-M, TSK gel Super HZ4000, TSK gel Super HZ3000, or TSK gel Super HZ2000 (manufactured by Tosoh Corporation) as a column. Unless specified otherwise, tetrahydrofuran (THF) is used as an eluent for measurement. In addition, unless specified otherwise, a detector that detects ultraviolet light (UV light) having a wavelength of 254 nm is used for detection.

A curable composition for imprinting according to an embodiment of the present invention includes: a monofunctional polymerizable compound; a bifunctional polymerizable compound; and a photopolymerization initiator, in which a content of the monofunctional polymerizable compound is 5 to 30 mass % with respect to a content of all the polymerizable compounds included in the curable composition for imprinting, a content of the bifunctional polymerizable compound is 70 mass % or higher with respect to the content of all the polymerizable compounds included in the curable composition for imprinting, at least one bifunctional polymerizable compound is a bifunctional polymerizable compound in which the number of atoms linking two polymerizable groups to each other is 2 or less, and a content of a bifunctional polymerizable compound that does not include an alicyclic structure and an aromatic ring structure and in which the number of atoms linking two polymerizable groups to each other is 3 or more is 30 mass % or lower with respect to the content of all the polymerizable compounds included in the curable composition for imprinting.

In addition, a curable composition for imprinting according to an embodiment of the present invention includes: a monofunctional polymerizable compound; a bifunctional polymerizable compound; and a photopolymerization initiator, in which a content of the monofunctional polymerizable compound is 5 to 30 mass % with respect to a content of all the polymerizable compounds included in the curable composition for imprinting, a content of the bifunctional polymerizable compound is 70 mass % or higher with respect to the content of all the polymerizable compounds included in the curable composition for imprinting, at least one bifunctional polymerizable compound is a bifunctional polymerizable compound that includes two polymerizable groups having an ethylenically unsaturated bond and in which the number of atoms linking the ethylenically unsaturated bonds to each other is 6 or less, and a content of a bifunctional polymerizable compound that does not include an alicyclic structure and an aromatic ring structure and in which the number of atoms linking two polymerizable groups to each other is 3 or more is 30 mass % or lower with respect to the content of all the polymerizable compounds included in the curable composition for imprinting.

In the present invention, it was found that, by fixing the content of the monofunctional polymerizable compound to a given value with respect to the content of all the polymerizable compounds and controlling the number of atoms linking the two polymerizable groups of the bifunctional polymerizable compound (or the ethylenically unsaturated bonds constituting the polymerizable groups), a fine structure having a size of 20 nm or less can be transferred without the occurrence of defects such as pattern collapse while securing the filling properties of the curable composition for imprinting to a mold and the releasability from the mold.

Further, in the present invention, a curable composition for imprinting that has a low viscosity, excellent etching resistance and is not likely to be volatilized can be obtained.

Hereinafter, the details of the present invention will be described.

<Monofunctional Polymerizable Compound>

The kind of the monofunctional polymerizable compound used in the present invention is not particularly limited within a range not departing from the scope of the present invention. It is preferable that the monofunctional polymerizable compound used in the present invention has a plastic structure. In the present invention, as the monofunctional polymerizable compound, only one kind may be included, or two or more kinds may be included.

The molecular weight of the monofunctional polymerizable compound used in the present invention is preferably 1000 or lower and more preferably 800 or lower. The lower limit value of the molecular weight is not particularly limited and may be, for example, 100 or higher.

A boiling point of the monofunctional polymerizable compound used in the present invention at 101325 Pa is preferably 85° C. or higher and more preferably 90° C. or higher. The upper limit value of the boiling point is not particularly limited and may be, for example, 400° C. or lower.

It is preferable that the monofunctional polymerizable compound used in the present invention is liquid at 25° C. By using a compound that is liquid at 25° C., the curable composition for imprinting may not substantially include a solvent. Here, substantially not including a solvent represents that, for example, the content of the solvent in the curable composition for imprinting according to the embodiment of the present invention is preferably 3 mass % or lower, more preferably 1 mass %, and still more preferably 0.5 mass % or lower.

The kind of the polymerizable group included in the monofunctional polymerizable compound used in the present invention is not particularly limited, and examples of the polymerizable group include an ethylenically unsaturated bond-containing group and an epoxy group. Among these, an ethylenically unsaturated bond-containing group is preferable. Examples of the ethylenically unsaturated bond-containing group include a group having a (meth)acryl group, a vinyl group, and a vinyl ether group. Among these, a group having a (meth)acryl group is preferable, and a group having an acryl group is more preferable. In addition, it is preferable that the group having a (meth)acryl group is a (meth)acryloyloxy group. That is, in the present invention, it is preferable that the monofunctional polymerizable compound is a (meth)acrylate.

The kind of atoms constituting the monofunctional polymerizable compound used in the present invention is not particularly limited, it is preferable that the monofunctional polymerizable compound consists of only atoms selected from the group consisting of a carbon atom, an oxygen atom, a hydrogen atom, a silicon atom, and a halogen atom, it is more preferable that the monofunctional polymerizable compound consists of only atoms selected from the group consisting of a carbon atom, an oxygen atom, a hydrogen atom, and a halogen atom, and it is still more preferable that the monofunctional polymerizable compound consists of only atoms selected from the group consisting of a carbon atom, an oxygen atom, and a hydrogen atom.

An Ohnishi parameter of the monofunctional polymerizable compound used in the present invention is preferably 4.0 or lower and more preferably 3.8 or lower. The lower limit value of the Ohnishi parameter is not particularly limited and may be, for example, 2.2 or higher.

It is preferable that the monofunctional polymerizable compound used in the present invention has a plastic structure. For example, it is preferable that at least one monofunctional polymerizable compound used in the present invention includes one group selected from the group consisting of the following (1) to (3):

(1) a group that includes at least one of an alkyl chain or an alkenyl chain and at least one of an alicyclic structure or an aromatic ring structure and in which the total number of carbon atoms is 8 or more (hereinafter, also referred to as "group (1)");

(2) a group that includes an alkyl chain having 4 or more carbon atoms (hereinafter, also referred to as "group (2)"); and (3) a group that includes an alkenyl chain having 4 or more carbon atoms (hereinafter, also referred to as "group (3)").

With the above-described configuration, the modulus of elasticity of a cured film can be efficiently reduced while reducing the addition amount of the monofunctional polymerizable compound included in the curable composition for imprinting. Further, the interfacial energy with the mold can be reduced, and the effect of reducing the releasing force (effect of improving the releasability) can be improved.

In the groups (1) to (3), the alkyl chain and the alkenyl chain may be linear, branched, or cyclic, and it is preferable that the alkyl chain and the alkenyl chain are each independently linear or branched. In addition, in the groups (1) to (3), it is preferable that the alkyl chain and/or the alkenyl chain is present at a terminal of the monofunctional polymerizable compound, that is, is present as an alkyl group and/or an alkenyl group. With the above-described structure, releasability can be further improved.

The alkyl chain and the alkenyl chain may each independently include an ether group (—O—). However, it is preferable that the alkyl chain and the alkenyl chain does not include an ether group from the viewpoint of improving the releasability.

<<Group (1)>>

In the group (1), the total number of carbon atoms is 8 or more and preferably 10 or more. The upper limit of the total number of carbon atoms is not particularly limited and is preferably 35 or less.

In addition, the number of carbon atoms constituting the alkyl chain and/or the alkenyl chain is preferably 5 or more, more preferably 6 or more, and still more preferably 8 or more. The upper limit value of the number of carbon atoms constituting the alkyl chain and/or the alkenyl chain is not particularly limited and may be, for example, 25 or less.

As the cyclic structure, a monocycle or a fused ring including 3 to 8-membered rings is preferable. The number of rings constituting the fused ring is preferably 2 or 3. As the cyclic structure, a 5-membered or 6-membered ring is more preferable, and a 6-membered ring is still more preferable. In addition, a monocycle is more preferable. As the cyclic structure in the group (1), a cyclohexane ring, a benzene ring, or a naphthalene ring is more preferable, and a benzene ring is still more preferable. In addition, as the cyclic structure, an aromatic ring structure is preferable.

The number of cyclic structures in the group (1) may be 1 or 2 or more and is preferably 1 or 2 and more preferably 1. In the case of the fused ring, the fused ring is considered as one cyclic structure.

As the group (1), a structure represented by cyclic structure-alkyl chain or alkenyl chain-*, or *-cyclic structure-alkyl group or alkenyl group is preferable, and a structure represented by *-cyclic structure-alkyl group or alkenyl group is more preferable. Here, * represents a binding site to another portion.

<<Group (2)>>

The group (2) is a group that includes an alkyl chain having 4 or more carbon atoms and is preferably a group (that is, an alkyl group) that consists of only an alkyl chain having 4 or more carbon atoms. The number of carbon atoms in the alkyl chain is preferably 7 or more and more preferably 9 or more. The upper limit value of carbon atoms in the alkyl chain is not particularly limited and may be, for example, 25 or less.

<<Group (3)<<

The group (3) is a group that includes an alkenyl chain having 4 or more carbon atoms and is preferably a group (that is, an alkylene group) that consists of only an alkenyl chain having 4 or more carbon atoms. The number of carbon atoms in the alkenyl chain is preferably 7 or more and more preferably 9 or more. The upper limit value of carbon atoms in the alkenyl chain is not particularly limited and may be, for example, 25 or less.

As the monofunctional polymerizable compound used in the present invention, a compound in which one or more groups selected from the groups (1) to (3) and a polymerizable group are bonded to each other directly or through a linking group is preferable, and a compound in which one group selected from the groups (1) to (3) and a polymerizable group are bonded to each other directly is more preferable. Examples of the linking group include —O—, —C(=O)—, —CH$_2$—, and a combination thereof.

Hereinafter, monofunctional polymerizable compounds which are preferably used in the present invention will be shown as examples. However, it is needless to say that the present invention is not limited to these examples. In addition, a first group, a second group, and a third group are preferable in this order.

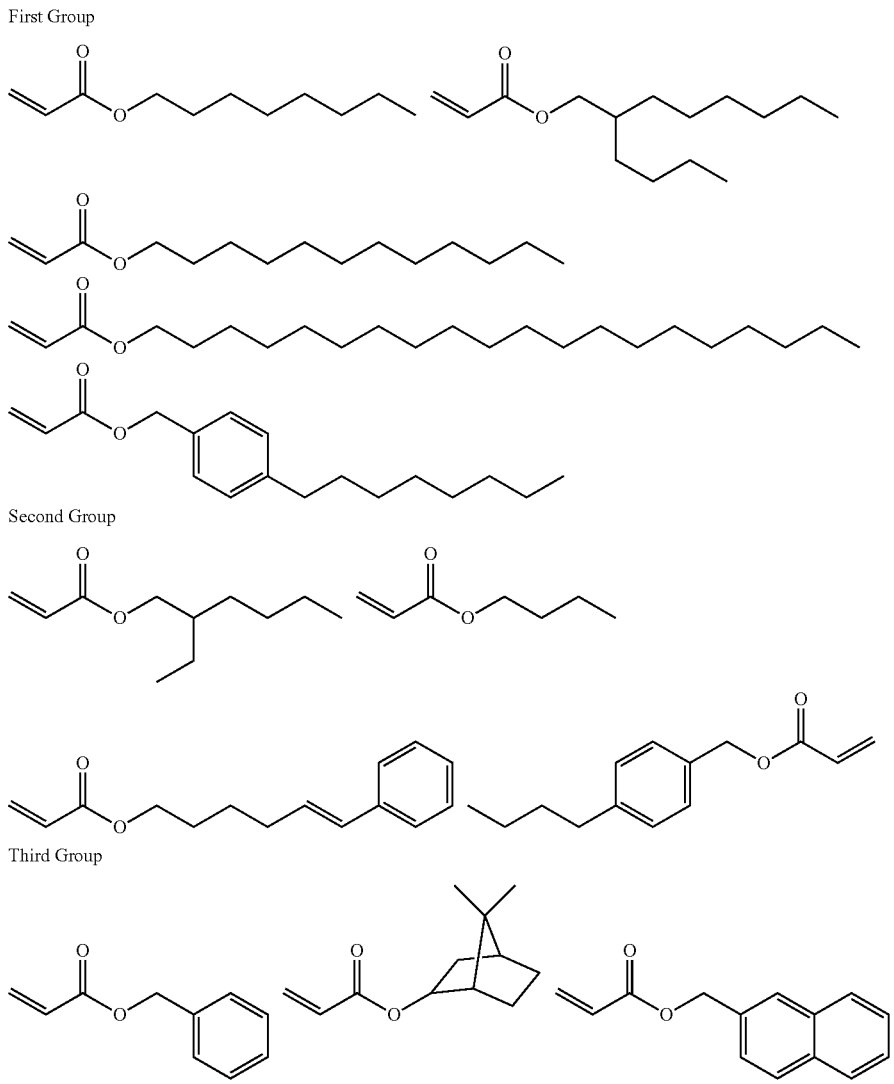

-continued

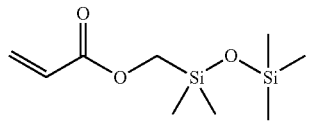

As a commercially available product of the monofunctional polymerizable compound, a compound having the above-described structure (manufactured by Shin-Nakamura Chemical Co., Ltd.) can be used.

The content of the monofunctional polymerizable compound used in the present invention is 5 to 30 mass % with respect to the content of all the polymerizable compounds in the curable composition for imprinting. The lower limit value is preferably 8 mass % or higher and more preferably 10 mass % or higher. In addition, the upper limit value is preferably 29 mass % or lower, more preferably 28 mass % or lower, and still more preferably 25 mass % or lower. By adjusting the lower limit value of the content to be 5 mass % or higher, the releasability tends to be improved, defects or mold breakage can be more effectively suppressed during mold release. In addition, by adjusting the upper limit value of the content to be 30 mass % or lower, the pattern strength of the curable composition for imprinting can be maintained, and pattern collapse can be suppressed during transfer of a pattern having a size of 20 nm or less.

In the curable composition for imprinting according to the embodiment of the present invention, a mass ratio between the monofunctional polymerizable compound and the bifunctional polymerizable compound is preferably 1:18 to 1:3.

<Bifunctional Polymerizable Compound>

The curable composition for imprinting according to the embodiment of the present invention includes a bifunctional polymerizable compound.

The kind of atoms constituting the bifunctional polymerizable compound used in the present invention is not particularly limited, it is preferable that the bifunctional polymerizable compound consists of only atoms selected from the group consisting of a carbon atom, an oxygen atom, a hydrogen atom, and a halogen atom, and it is more preferable that the bifunctional polymerizable compound consists of only atoms selected from the group consisting of a carbon atom, an oxygen atom, and a hydrogen atom.

The kind of the polymerizable group included in the bifunctional polymerizable compound is not particularly limited, and examples of the polymerizable group include an ethylenically unsaturated bond-containing group and an epoxy group. Among these, an ethylenically unsaturated bond-containing group is preferable. Examples of the ethylenically unsaturated bond-containing group include a group having a (meth)acryl group, a vinyl group, and a vinyl ether group. Among these, a group having a (meth)acryl group is preferable, and a group having an acryl group is more preferable. In addition, it is preferable that the group having a (meth)acryl group is a (meth)acryloyloxy group.

Examples of the polymerizable group in the present invention include a vinyl group, a (meth)acryloyloxy group, a (meth)acryloylamide group, an epoxy group, and a vinyl ether group.

As the bifunctional polymerizable compound used in the present invention, different two kinds of polymerizable groups may be added, or the same kind of two polymerizable groups may be added.

In the curable composition for imprinting according to the embodiment of the present invention, the lower limit value of the content of the bifunctional polymerizable compound is 70 mass % or higher and preferably 73 mass % or higher with respect to the content of all the polymerizable compounds. The upper limit value of the content is preferably 95 mass % or lower and more preferably 93 mass % or lower.

In the curable composition for imprinting according to the embodiment of the present invention, it is preferable that 40 mass % or higher of all the polymerizable compounds included in the composition have at least one of an alicyclic structure or an aromatic ring structure, it is more preferable that 40 to 100 mass % of all the polymerizable compounds included in the composition has at least one of an alicyclic structure or an aromatic ring structure, and it is still more preferable that 40 to 90 mass % of all the polymerizable compounds included in the composition has at least one of an alicyclic structure or an aromatic ring structure. With the above-described configuration, the Ohnishi parameter is reduced, and etching resistance tends to be further improved.

As the cyclic structure, a hydrocarbon group is preferable. The hydrocarbon group may be an aromatic hydrocarbon group or an alicyclic hydrocarbon group. As the cyclic structure, a 5-membered or 6-membered ring or a fused ring thereof is preferable. The number of cyclic structures in one molecule is preferably one. As described above, in the case of the fused ring, the fused ring is considered as one cyclic structure.

In addition, a viscosity of the bifunctional polymerizable compound that has at least one of an alicyclic structure or an aromatic ring structure at 25° C. is preferably 125 mPa·s or lower, more preferably 50 mPa·s or lower, still more preferably 30 mPa·s or lower, and even still more preferably 25 mPa·s or lower. With the above-described configuration, the filling properties into the mold tend to be further improved. The lower limit value of the viscosity is preferably 1 mPa·s or higher and more preferably 5 mPa·s or higher. In the above-described range, etching resistance tends to be further improved.

The bifunctional polymerizable compound that has at least one of an alicyclic structure or an aromatic ring structure may be a bifunctional polymerizable compound in which the number of atoms linking two polymerizable groups to each other is 2 or less, or may be a bifunctional polymerizable compound in which the number of atoms linking two polymerizable groups to each other is 3 or more and/or a bifunctional polymerizable compound that includes two polymerizable groups having an ethylenically unsaturated bond and in which the number of atoms linking the ethylenically unsaturated bonds to each other is 6 or less.

Hereinafter, the bifunctional polymerizable compound in which the number of atoms linking two polymerizable groups to each other is 2 or less and/or the bifunctional polymerizable compound that includes two polymerizable groups having an ethylenically unsaturated bond and in which the number of atoms linking the ethylenically unsaturated bonds to each other is 6 or less (hereinafter, also referred to as "short-chain bifunctional compound"), and the bifunctional polymerizable compound in which the number of atoms linking two polymerizable groups to each other is 3 or more (hereinafter, also referred to as "long-chain bifunctional compound") will be separately described regarding more preferable ranges.

<<Bifunctional Polymerizable Compound in which Number of Atoms Linking Two Polymerizable Groups to Each Other is 2 or Less>>

The bifunctional polymerizable compound used in the present invention is a bifunctional polymerizable compound in which the number of atoms linking two polymerizable groups to each other is 2 or less and/or a bifunctional polymerizable compound that includes two polymerizable groups having an ethylenically unsaturated bond and in which the number of atoms linking the ethylenically unsaturated bonds to each other is 6 or less (short-chain bifunctional compound). In the present invention, by using the short-chain bifunctional compound, pattern extension during stretching can be suppressed. As a result, pattern deformation during mold release is suppressed, and it is presumed that the occurrence of pattern collapse does not occur during transfer of an ultrafine pattern having a size of 20 nm or less.

Here, the number of atoms linking two polymerizable groups to each other refers to the minimum number of atoms linking one polymerizable group to another polymerizable group. For example, in the following compound, portions (acryloyloxy groups) surrounded by squares are polymerizable groups, and atoms linking the polymerizable group to each other are two carbon atoms represented by 1 and 2 shown below.

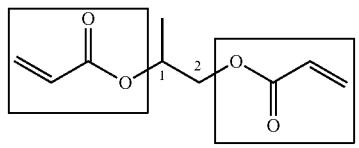

In addition, the number of atoms linking the ethylenically unsaturated bonds to each other is presumed to be as described above. For example, in the above-described compound, atoms linking the ethylenically unsaturated bonds to each other are six atoms including a carbon atom adjacent to an ethylenically unsaturated bond, an oxygen atom, the carbon atom represented by 1 shown above, the carbon atom represented by 2 shown above, an oxygen atom, and a carbon atom adjacent to another ethylenically unsaturated bond.

As the atoms linking polymerizable groups to each other in the short-chain bifunctional compound, a carbon atom, a sulfur atom, an oxygen atom, a nitrogen atom, or a silicon atom is preferable, and a carbon atom is more preferable.

It is preferable that the short-chain bifunctional compound used in the present invention is represented by polymerizable group-$CR_2$—$CR_2$-polymerizable group (R's each independently represent a hydrogen atom or a substituent). R's each independently represent preferably a hydrogen atom or a hydrocarbon group having 1 to 10 carbon atoms, more preferably a hydrogen atom or a hydrocarbon group having 1 to 6 carbon atoms, and still more preferably a hydrogen atom or a hydrocarbon group having 1 to 3 carbon atoms. As the hydrocarbon group, an alkyl group or an aryl group is preferable, a linear or branched alkyl group is more preferable, and a linear alkyl group is still more preferable. It is preferable that the short-chain bifunctional compound used in the present invention is represented by polymerizable group-$CHR^1$—$CHR^1$-polymerizable group ($R^1$'s each independently represent a hydrocarbon group), polymerizable group-$CH_2$—$CHR^1$-polymerizable group ($R^1$ represents a hydrocarbon group), or polymerizable group-$CH_2$—$CH_2$-polymerizable group, and it is more preferable that the short-chain bifunctional compound used in the present invention is represented by polymerizable group-$CHR^1$—$CHR^1$-polymerizable group ($R^1$'s each independently represent a hydrocarbon group).

The short-chain bifunctional compound used in the present invention may include a cyclic structure as a side chain, that is, as a substituent that is bonded to an atom linking two polymerizable groups to each other. However, by the short-chain bifunctional compound including the cyclic structure, the viscosity of the compound increases. Therefore, from the viewpoint of reducing the viscosity, it is preferable that the short-chain bifunctional compound does not include the cyclic structure.

The viscosity of the short-chain bifunctional compound used in the present invention at 25° C. is preferably 30 mPa·s or lower, more preferably 10 mPa·s or lower, still more preferably 7 mPa·s or lower, and even still more preferably 5 mPa·s or lower. The lower limit value of the viscosity is not particularly limited and may be 1 mPa·s or higher.

From the viewpoint of residual film uniformity, a boiling point of the short-chain bifunctional compound used in the present invention at 101325 Pa (1 atm) is preferably 210° C. or higher, more preferably 230° C. or higher, and still more preferably 240° C. or higher. The upper limit of the boiling point of the short-chain bifunctional compound is not particularly limited and is sufficiently practical at, for example, 500° C. or lower.

An Ohnishi parameter of the short-chain bifunctional compound used in the present invention is preferably 5.5 or lower and more preferably 5.0 or lower. The lower limit value of the Ohnishi parameter is not particularly limited and may be, for example, 3.0 or higher and 4.0 or higher.

Hereinafter, examples of the short-chain bifunctional compound which can be used in the present invention will be shown below. It is needless to say that the present invention is not limited to these examples.

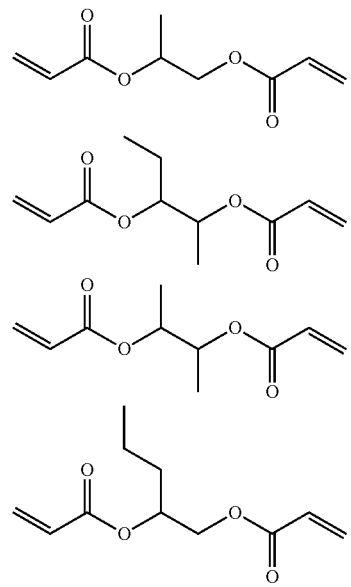

-continued

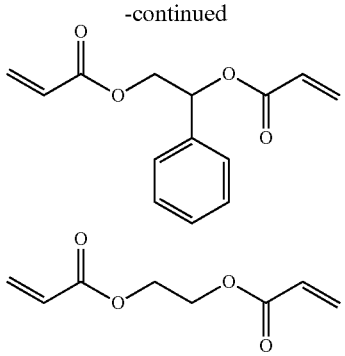

The content of the short-chain bifunctional compound is preferably 1 to 80 mass %, more preferably 10 to 40 mass %, and still more preferably 10 to 20 mass % with respect to the content of all the polymerizable compounds included in the curable composition for imprinting.

The curable composition for imprinting according to the embodiment of the present invention may include one short-chain bifunctional compound or two or more short-chain bifunctional compounds. In a case where the curable composition for imprinting according to the embodiment of the present invention includes two or more short-chain bifunctional compounds, it is preferable that the total content of the two or more short-chain bifunctional compounds is in the above-described range.

<<Bifunctional Polymerizable Compound in which Number of Atoms Linking Two Polymerizable Groups to Each Other is 3 or More>>

The bifunctional polymerizable compound used in the present invention may include a bifunctional compound other than the short-chain bifunctional compound. Examples of the bifunctional compound other than the short-chain bifunctional compound include a bifunctional polymerizable compound in which the number of atoms linking two polymerizable groups to each other is 3 or more (long-chain bifunctional compound). By adding the above-described compound, the volatilization of the curable composition is suppressed, and the residual film uniformity of a cured pattern after imprint is improved.

The number of atoms linking polymerizable groups to each other in the long-chain bifunctional compound is preferably 3 to 12, more preferably 3 to 9, and still more preferably 3 to 5.

The viscosity of the long-chain bifunctional compound used in the present invention at 25° C. is preferably 130 mPa·s or lower, more preferably 20 mPa·s or lower, and still more preferably 10 mPa·s or lower. The lower limit value of the viscosity is not particularly limited and may be 1 mPa·s or higher.

From the viewpoint of residual film uniformity, a boiling point of the long-chain bifunctional compound used in the present invention at 101325 Pa (1 atm) is preferably 230° C. or higher, more preferably 250° C. or higher, and still more preferably 258° C. or higher. The upper limit of the boiling point of the long-chain bifunctional compound is not particularly limited and is sufficiently practical at, for example, 300° C. or lower.

An Ohnishi parameter of the long-chain bifunctional compound used in the present invention is preferably 4.5 or lower. The lower limit value of the Ohnishi parameter is not particularly limited and may be, for example, 3.0 or higher and 3.1 or higher.

The long-chain bifunctional compound according to the present invention may have or may not have a cyclic structure (an alicyclic structure and/or an aromatic ring structure). In addition, a part of the cyclic structure may be atoms linking two polymerizable groups to each other (for example, A-7 to A9 used in Examples described below), or a cyclic structure (for example, A-5 used in Examples described below) may be included as a substituent bonded to the atoms linking two polymerizable groups to each other.

In a case where the curable composition for imprinting according to the embodiment of the present invention includes the long-chain bifunctional compound, the content thereof is preferably 30 to 80 mass %, more preferably 35 to 75 mass %, still more preferably 40 to 75 mass %, and even still more preferably 60 to 75 mass % with respect to the content of all the polymerizable compounds.

The curable composition for imprinting according to the embodiment of the present invention may include one long-chain bifunctional compound or two or more long-chain bifunctional compounds. In a case where the curable composition for imprinting according to the embodiment of the present invention includes two or more long-chain bifunctional compounds, it is preferable that the total content of the two or more long-chain bifunctional compounds is in the above-described range.

In addition, in the present invention, the curable composition for imprinting may also not substantially include the long-chain bifunctional compound. Substantially not including the long-chain bifunctional compound represents that the content of the long-chain bifunctional compound is 1 mass % or lower with respect to the content of all the polymerizable compounds included in the curable composition for imprinting according to the embodiment of the present invention.

Hereinafter, a bifunctional polymerizable compound that includes at least one of an alicyclic structure or an aromatic ring structure and in which the number of atoms linking two polymerizable groups to each other is 3 or more (hereinafter, also referred to as "long-chain cyclic group-containing bifunctional compound") and a bifunctional polymerizable compound that does not include an alicyclic structure and an aromatic ring structure and in which the number of atoms linking two polymerizable groups to each other is 3 or more (hereinafter, also referred to as "long-chain cyclic group non-containing bifunctional compound") will be separately described regarding more preferable ranges.

<<<Bifunctional Polymerizable Compound that includes at Least One of Alicyclic Structure or Aromatic Ring Structure and in which Number of Atoms Linking Two Polymerizable Groups to Each Other is 3 or More>>>

The long-chain bifunctional compound that includes at least one of an alicyclic structure or an aromatic ring structure and in which the number of atoms linking two polymerizable groups to each other is 3 or more (long-chain cyclic group-containing bifunctional compound) will be described.

It is preferable that the long-chain cyclic group-containing bifunctional compound is represented by polymerizable group-L-cyclic structure-L-polymerizable group (L's each independently represent a single bond or a linking group). In a case where L represents a linking group, an alkylene group is preferable, an alkylene group having 1 to 3 carbon atoms is more preferable, and an alkylene group having 1 or 2 carbon atoms is still more preferable.

It is preferable that the long-chain cyclic group-containing bifunctional compound is a (meth)acrylate.

The viscosity of the long-chain cyclic group-containing bifunctional compound used in the present invention at 25° C. is preferably 130 mPa·s or lower, more preferably 20 mPa·s or lower, and still more preferably 10 mPa·s or lower. The lower limit value of the viscosity is not particularly limited and is preferably 1 mPa·s or higher.

From the viewpoint of residual film uniformity, a boiling point of the long-chain cyclic group-containing bifunctional compound used in the present invention at 101325 Pa (1 atm) is preferably 255° C. or higher and more preferably 260° C. or higher. The upper limit of the boiling point of the long-chain cyclic group-containing bifunctional compound is not particularly limited and is sufficiently practical at, for example, 320° C. or lower.

An Ohnishi parameter of the long-chain cyclic group-containing bifunctional compound used in the present invention is preferably 4.3 or lower. The lower limit value of the Ohnishi parameter is not particularly limited and may be, for example, 3.0 or higher and 3.1 or higher.

Hereinafter, examples of the long-chain cyclic group-containing bifunctional compound will be shown. It is needless to say that the long-chain cyclic group-containing bifunctional compound according to the present invention is not limited to these examples.

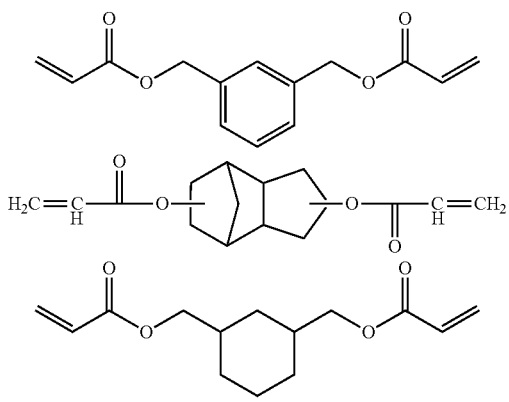

In a case where the curable composition for imprinting includes the long-chain cyclic group-containing bifunctional compound, the content thereof is preferably 10 to 80 mass %, more preferably 40 to 75 mass %, and still more preferably 60 to 75 mass % with respect to the content of all the polymerizable compounds.

The curable composition for imprinting according to the embodiment of the present invention may include one long-chain cyclic group-containing bifunctional compound or two or more long-chain cyclic group-containing bifunctional compounds. In a case where the curable composition for imprinting according to the embodiment of the present invention includes two or more long-chain cyclic group-containing bifunctional compounds, it is preferable that the total content of the two or more long-chain cyclic group-containing bifunctional compounds is in the above-described range.

On the other hand, in the present invention, the curable composition for imprinting may also not substantially include the long-chain cyclic group-containing bifunctional compound. Substantially not including the long-chain cyclic group-containing bifunctional compound represents that the content of the long-chain cyclic group-containing bifunctional compound is 1 mass % or lower with respect to the content of all the polymerizable compounds included in the curable composition for imprinting according to the embodiment of the present invention.

<<<Bifunctional Polymerizable Compound that does not include Alicyclic Structure or Aromatic Ring Structure and in which Number of Atoms Linking Two Polymerizable Groups to Each Other is 3 or More>>>

The long-chain bifunctional compound that does not include an alicyclic structure and an aromatic ring structure and in which the number of atoms linking two polymerizable groups to each other is 3 or more (long-chain cyclic group non-containing bifunctional compound) will be described.

It is preferable that the long-chain cyclic group non-containing bifunctional compound is represented by polymerizable group-linear or branched hydrocarbon group-polymerizable group. As the hydrocarbon group, an alkylene group is preferable, and an alkylene group having 3 to 10 carbon atoms is more preferable. It is preferable that the alkylene group is a linear or branched alkylene group. In the case of the branched alkylene group, it is preferable that a branched chain of the alkylene group is a methyl group.

It is preferable that the long-chain cyclic group non-containing bifunctional compound is a (meth)acrylate.

The viscosity of the long-chain cyclic group non-containing bifunctional compound at 25° C. is preferably 50 mPa·s or lower, more preferably 20 mPa·s or lower, and still more preferably 10 mPa·s or lower. The lower limit value of the viscosity is not particularly limited and may be, for example, 1 mPa·s or higher and 3 mPa·s or higher.

From the viewpoint of residual film uniformity, a boiling point of the long-chain cyclic group non-containing bifunctional compound used in the present invention at 101325 Pa (1 atm) is preferably 230° C. or higher and more preferably 260° C. or higher. The upper limit of the boiling point of the long-chain cyclic group non-containing bifunctional compound is not particularly limited and is sufficiently practical at, for example, 300° C. or lower.

An Ohnishi parameter of the long-chain cyclic group non-containing bifunctional compound used in the present invention is preferably 4.5 or lower. The lower limit value of the Ohnishi parameter is not particularly limited and may be, for example, 3.0 or higher and 3.5 or higher.

Hereinafter, examples of the long-chain cyclic group non-containing bifunctional compound will be shown. It is needless to say that the long-chain cyclic group non-containing bifunctional compound according to the present invention is not limited to these examples.

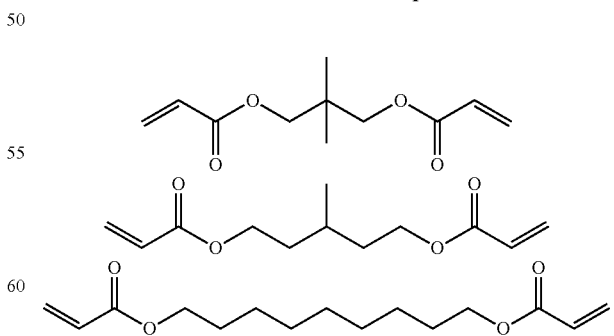

In a case where the curable composition for imprinting includes the long-chain cyclic group non-containing bifunctional compound, the lower limit of the content of the long-chain cyclic group non-containing bifunctional compound is preferably 1 mass % or higher and more preferably 5 mass % or higher with respect to the content of all the polymerizable compounds. In addition, the upper limit of the content of the long-chain cyclic group non-containing bifunctional compound is 30 mass % or lower and preferably 15 mass % or lower with respect to the content of all the polymerizable compounds included in the curable composition for imprinting.

The curable composition for imprinting according to the embodiment of the present invention may include one long-chain cyclic group non-containing bifunctional compound or two or more long-chain cyclic group non-containing bifunctional compounds. In a case where the curable composition for imprinting according to the embodiment of the present invention includes two or more long-chain cyclic group non-containing bifunctional compounds, the total content of the two or more long-chain cyclic group non-containing bifunctional compounds is in the above-described range.

On the other hand, in the present invention, the curable composition for imprinting may also not substantially include the long-chain cyclic group non-containing bifunctional compound. For example, the content of the long-chain cyclic group non-containing bifunctional compound may be 3 mass % or lower or 1 mass % or lower with respect to the content of all the polymerizable compounds.

<<Trifunctional or Higher Polymerizable Compound>>

The curable composition for imprinting according to the embodiment of the present invention may include or may not include a trifunctional or higher polymerizable compound.

In the present invention, the content of the trifunctional or higher polymerizable compound is preferably 3 mass % or lower, more preferably 1 mass % or lower, and still more preferably 0.1 mass % or lower with respect to the content of all the polymerizable compounds included in the curable composition for imprinting. In the above-described range, an increase in the viscosity of the curable composition can be suppressed, and excellent filling properties can be maintained.

In addition, the total content of the polymerizable compounds is preferably 90 mass % or higher with respect to the total solid content of the curable composition for imprinting according to the embodiment of the present invention. In addition, the upper limit value of the total content is preferably 99 mass % or lower.

<Photopolymerization Initiator>

The curable composition for imprinting according to the embodiment of the present invention includes a photopolymerization initiator.

As the photopolymerization initiator used in the present invention, any compound that generates an active species for polymerization of the above-described polymerizable compounds by light irradiation can be used. As the photopolymerization initiator, a radical photopolymerization initiator or a cationic photopolymerization initiator is preferable, and a radical photopolymerization initiator is more preferable.

As the radical photopolymerization initiator used in the present invention, for example, a commercially available initiator can be used. For example, compounds described paragraph "0091" of JP2008-105414A can be preferably adopted. In particular, an acetophenone compound, an acylphosphine oxide compound, or an oxime ester compound is preferable from the viewpoints of curing sensitivity and absorption properties.

Specifically, for example, the following photopolymerization initiators can be used.

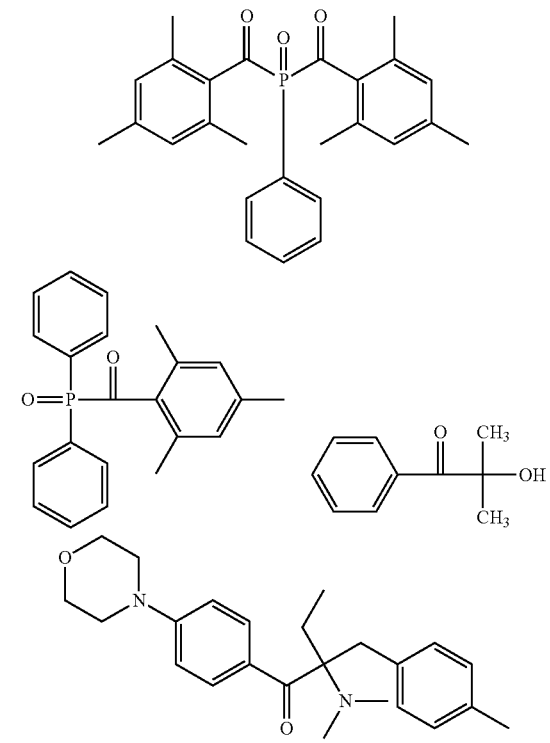

As the photopolymerization initiator, one kind may be used alone, but it is preferable that two or more kinds are used in combination. In a case where two or more kinds of polymerization initiators are used in combination, it is more preferable that two or more kinds of radical photopolymerization initiators are used in combination.

The content of the photopolymerization initiator used in the present invention is preferably 0.01 to 15 mass %, more preferably 0.1 to 10 mass %, still more preferably 0.5 to 7 mass %, and even still more preferably 1 to 5 mass % with respect to the total content of the composition excluding the solvent. In a case where two or more photopolymerization initiators are used, the total content of the photopolymerization initiators is in the above-described range. In a case where the content of the photopolymerization initiator is 0.01 mass % or higher, sensitivity (fast curing properties) resolution ability, line edge roughness, and coating film hardness tends to be further improved, which is preferable. In addition, in a case where the content of the photopolymerization initiator is 15 mass % or lower, light-transmitting property, colorability, handleability, and the like tend to be further improved, which is preferable.

<Release Agent>

It is preferable that the curable composition for imprinting according to the embodiment of the present invention further includes a release agent.

The kind of the release agent used in the present invention is not particularly limited within a range not departing from the scope of the present invention. It is preferable that the release agent is an additive that is unevenly distributed at an interface with the mold and has a function of promoting release from the mold. Specific examples of the release agent include a surfactant and a non-polymerizable compound that has at least one hydroxyl group at a terminal or has a terminal hydroxyl group having an etherified polyalkylene glycol structure and does not substantially include a fluorine atom and a silicon atom (hereinafter, also referred to as "non-polymerizable compound having releasability").

As the release agent, only one kind may be included, or two or more kinds may be included. In addition, in a case where the release agent is included, the content thereof is preferably 0.1 to 20 mass % with respect to the total solid content of the composition.

<<Surfactant>>

As the surfactant, a nonionic surfactant is preferable.

The nonionic surfactant refers to a compound having at least one hydrophobic portion and at least one nonionic hydrophilic portion. Each of the hydrophobic portion and the hydrophilic portion may be present at a terminal of a molecule or in the molecule. The hydrophobic portion is formed of a hydrophobic group selected from the group consisting of a hydrocarbon group, a fluorine-containing group, and a Si-containing group, and the number of carbon atoms in the hydrophobic portion is preferably 1 to 25, more preferably 2 to 15, still more preferably 4 to 10, and most preferably 5 to 8. It is preferable that the nonionic hydrophilic portion has at least one group selected from the group consisting of an alcoholic hydroxyl group, a phenolic hydroxyl group, an ether group (preferably a polyoxyalkylene group or a cyclic ether group), an amido group, an imido group, an ureido group, a urethane group, a cyano group, a sulfonamide group, a lactone group, a lactam group, and a cyclocarbonate group. As the nonionic surfactant, a hydrocarbon nonionic surfactant, a fluorine nonionic surfactant, a Si nonionic surfactant, or a fluorine-Si nonionic surfactant may be used, a fluorine nonionic surfactant or a Si nonionic surfactant is more preferable, and a fluorine nonionic surfactant is still more preferable. Here, "fluorine-Si surfactant" refers to a surfactant having both functions of a fluorine surfactant and a Si surfactant.

Examples of a commercially available product of the fluorine nonionic surfactant include: FLUORAD FC-4430 and FC-4431 (manufactured by Sumitomo 3M Ltd.); SURFLON S-241, S-242, and S-243 (manufactured by Asahi Glass Co., Ltd.); F-TOP EF-PN31M-03, EF-PN31M-04, EF-PN31M-05, EF-PN31M-06, and MF-100 (manufactured by Mitsubishi Materials Corporation); PolyFox PF-636, PF-6320, PF-656, and PF-6520 (manufactured by OMNOVA Solutions Inc.); FTERGENT 250, 251, 222F, 212M, and DFX-18 (manufactured by Neos Co., Ltd.); UNIDYNE DS-401, DS-403, DS-406, DS-451, and DSN-403N (manufactured by Daikin Industries, Ltd.); MEGAFACE F-430, F-444, F-477, F-553, F-556, F-557, F-559, F-562, F-565, F-567, F-569, and R-40 (manufactured by DIC Corporation); and Capstone FS-3100 and ZONYL FSO-100 (manufactured by DuPont).

In a case where the curable composition for imprinting according to the embodiment of the present invention includes the surfactant, the content of the surfactant is preferably 0.1 to 10 mass %, more preferably 0.2 to 5 mass %, and still more preferably 0.5 to 5 mass % with respect to the total content of the composition excluding the solvent. The curable composition for imprinting may include one surfactant or two or more surfactants. In a case where the infrared absorbing composition includes two or more surfactants, it is preferable that the total content of the two or more surfactants is in the above-described range.

<<Non-Polymerizable Compound Having Releasability>>

The curable composition for imprinting may include a non-polymerizable compound that has at least one hydroxyl group at a terminal or has a terminal hydroxyl group having an etherified polyalkylene glycol structure and does not substantially include a fluorine atom and a silicon atom. Here, the non-polymerizable compound refers to a compound not having a polymerizable group. In addition, substantially not including a fluorine atom and a silicon atom represents that, for example, the total content of a fluorine atom and a silicon atom is 1 mass % or lower with respect to the content of the non-polymerizable compound. It is preferable that the total content of a fluorine atom and a silicon atom is 0.1 mass % or lower, and it is more preferable that a fluorine atom and a silicon atom are not completely included. By the curable composition for imprinting not including a fluorine atom and a silicon atom, compatibility with the polymerizable compound can be improved. In particular, in the curable composition for imprinting that does not include the solvent, coating uniformity, pattern formability during imprint, and line edge roughness after dry etching are improved.

As the polyalkylene glycol structure included in the non-polymerizable compound having releasability, a polyalkylene glycol structure that includes an alkylene group having 1 to 6 carbon atoms is preferable, a polyethylene glycol structure, a polypropylene glycol structure, a polybutylene glycol structure, or a mixed structure thereof is more preferable, a polyethylene glycol structure, a polypropylene glycol structure, or a mixed structure thereof is more preferable, and a polypropylene glycol structure is still more preferable.

Further, the non-polymerizable compound having releasability may substantially consist of only the polyalkylene glycol structure excluding the terminal substituent. Here, "substantially" represents that the content of components other than the polyalkylene glycol structure is 5 mass % or lower and preferably 1 mass % or lower with respect to the total content of the non-polymerizable compound having releasability. In particular, it is preferable that a compound that substantially consists of only the polypropylene glycol structure is included as the non-polymerizable compound having releasability.

As the polyalkylene glycol structure, it is preferable that 3 to 100 alkylene glycol constitutional units are included, it is more preferable that 4 to 50 alkylene glycol constitutional units are included, it is still more preferable that 5 to 30 alkylene glycol constitutional units are included, and it is even still more preferable that 6 to 20 alkylene glycol constitutional units are included.

It is preferable that the non-polymerizable compound having releasability has at least one hydroxyl group at a terminal or has a terminal hydroxyl group that is etherified. As long as the non-polymerizable compound having releasability has at least one hydroxyl group at a terminal or has a terminal hydroxyl group that is etherified, even in a case where the remaining terminal group is a hydroxyl group, a hydrogen atom in the terminal hydroxyl group may be substituted. As a group which may be substituted with the hydrogen atom in the terminal hydroxyl group, an alkyl group (that is, polyalkylene glycol alkyl ether) or an acyl group (that is, polyalkylene glycol ester) is preferable. Polyalkylene glycol in which all the terminal groups are hydroxyl groups is more preferable. A compound including a plurality of (preferably two or three) polyalkylene glycol chains through a linking group can also be preferably used, and it is preferable that the compound has a linear structure in which the polyalkylene glycol chains are not branched. In particular, a diol type polyalkylene glycol is preferable.

Specific preferable examples of the non-polymerizable compound having releasability include polyethylene glycol, polypropylene glycol (for example, manufactured by Wako Pure Chemical Industries, Ltd.), mono- or dimethyl ether, mono- or dibutyl ether, mono- or dioctyl ether, mono- or dicetyl ether, monostearic acid ester, monooleic acid ester, polyoxyethylene glyceryl ether, polyoxypropylene glyceryl ether, and trimethyl ether thereof.

The weight-average molecular weight of the non-polymerizable compound having releasability is preferably 150 to 6000, more preferably 200 to 3000, still more preferably 250 to 2000, and even still more preferably 300 to 1200.

In addition, examples of the non-polymerizable compound having releasability which can be used in the present invention include a non-polymerizable compound having releasability which has an acetylene diol structure. Examples of a commercially available product of the non-polymerizable compound having releasability include OLFINE E1010 (manufactured by Nissin Chemical Co., Ltd.).

Specific examples of the non-polymerizable compound having releasability which can be preferably used in the present invention include compounds D-2 to D-4 used in Examples described below.

In a case where the curable composition for imprinting according to the embodiment of the present invention includes the non-polymerizable compound having releasability, the content of the non-polymerizable compound having releasability is preferably 0.1 to 20 mass %, more preferably 0.2 to 15 mass %, still more preferably 0.5 to 10 mass %, even still more preferably 0.5 to 5 mass %, and even yet still more preferably 0.5 to 4 mass % with respect to the total content of the composition excluding the solvent. The curable composition for imprinting may include one non-polymerizable compound having releasability or two or more non-polymerizable compounds having releasability. In a case where the infrared absorbing composition includes two or more non-polymerizable compounds having releasability, it is preferable that the total content of the two or more non-polymerizable compounds having releasability is in the above-described range.

<Other Components>

In addition to the above-described components, the curable composition for imprinting used in the present invention may further include other components within a range not departing from the scope of the present invention. Examples of the other components include a sensitizer, an antioxidant, a polymerization inhibitor (for example, 4-hydroxy-2,2,6,6-tetramethylpiperidine-1-oxyl free radical), an ultraviolet absorber, and a solvent. As each of these compounds, only one kind may be included, and two or more kinds may be included. The details of the other components can be found in paragraphs "0061" to "0064" of JP2014-170949A, the contents of which are incorporated herein by reference.

As described above, it is preferable that the curable composition for imprinting according to the embodiment of the present invention does not substantially include a solvent.

This way, the curable composition for imprinting according to the embodiment of the present invention does not necessarily include a solvent. However, a solvent may be optionally added, for example, in order to finely adjust the viscosity of the composition. Examples of the kind of the solvent which can be preferably used in the curable composition according to the embodiment of the present invention include solvents which are generally used in a curable composition for photoimprinting or a photoresist. The solvent is not particularly limited as long as it can dissolve and uniformly disperse the compound used in the present invention and is not reactive with the components. Examples of the solvent which can be used in the present invention include solvents described in paragraph "0088" of JP2008-105414A, the content of which is incorporated herein by reference.

In addition, it is preferable that the curable composition for imprinting according to the embodiment of the present invention does not substantially include a component having a molecular weight of 2000 or higher. "Substantially not including" represents that the content of the component having a molecular weight of 2000 or higher is 3 mass % or lower, preferably 1 mass % or lower, and more preferably 0.5 mass % or lower with respect to the total solid content of the curable composition for imprinting.

<Properties of Curable Composition for Imprinting>

The Ohnishi parameter of the curable composition for imprinting according to the embodiment of the present invention is preferably 5.0 or lower, more preferably 4.0 or lower, still more preferably 3.9 or lower, even still more preferably 3.7 or lower, and even yet still more preferably 3.6 or lower. By adjusting the Ohnishi parameter to be 5.0 or lower, etching resistance tends to be further improved.

The lower limit value of the Ohnishi parameter may be 3.0 or higher and 3.5 or higher.

A viscosity of the curable composition for imprinting according to the embodiment of the present invention at 23° C. is preferably 20 mPa·s or lower, more preferably 10 mPa·s or lower, and still more preferably 8 mPa·s or lower. The lower limit value of the viscosity is not particularly limited and may be, for example, 5 mPa·s or higher. In the above-described range, the curable composition for imprinting according to the embodiment of the present invention can be easily filled into the mold, and the mold filling time can be reduced. Further, pattern formability and throughput can also be improved.

The curable composition for imprinting according to the embodiment of the present invention may be filtered before use. For filtering, for example, a polytetrafluoroethylene (PTFE) filter can be used. In addition, the pore size during filtering is preferably 0.003 µm to 5.0 µm. The details of filtering can be found in paragraph "0070" of JP2014-170949A, the content of which is incorporated herein by reference.

In addition, the present invention discloses a cured product which is formed by curing the curable composition for imprinting according to the embodiment of the present invention. It is preferable that the cured product is provided on a silicon substrate.

A pattern forming method according to an embodiment of the present invention includes: applying the curable composition for imprinting according to the embodiment of the present invention to a substrate or a mold; and irradiating the curable composition for imprinting with light in a state where the curable composition for imprinting is interposed between the mold and the substrate.

A pattern that is formed using the pattern forming method according to the embodiment of the present invention is useful as an etching resist (mask for lithography). In a case where the pattern is used as an etching resist, first, a silicon substrate (for example, silicon wafer) on which a thin film such as $SiO_2$ is formed is used as a substrate, and, for example, a nano or micro-order fine pattern is formed on the substrate using the pattern forming method according to the embodiment of the present invention. In the present invention, in particular, a nano-order fine pattern can be formed. Further, a pattern having a size of 25 nm or less, in particular, 20 nm or less can also be formed. The lower limit value of a pattern size formed using the pattern forming method according to the embodiment of the present invention is not particularly limited and may be, for example, 10 nm or more. Here, the pattern size refers to the smallest dimension in the pattern that is formed using the pattern forming method according to the embodiment of the present invention. In the case of a line pattern, the pattern size refers to a line width of the pattern. In the case of a pillar/hole pattern, the pattern size refers to the diameter of the pattern.

Next, the substrate is etched by using etching gas, for example, hydrogen fluoride or the like in the case of wet etching or $CF_4$ or $CHF_3/CF_4/Ar$ mixed gas in the case of dry etching. As a result, a desired pattern can be formed on the substrate. The pattern has excellent etching resistance to, in particular, dry etching. That is, the pattern that is formed using the pattern forming method according to the embodiment of the present invention is preferably used a mask for lithography.

The details of the pattern forming method can be can be found in paragraphs "0057" to "0071" of JP2015-185798A, the content of which is incorporated herein by reference.

In addition, a semiconductor device can also be manufactured by using the above-described pattern as an etching mask. Specifically, a treatment is performed on a substrate using the above-described pattern as an etching mask For example, an upper layer of the substrate is selectively removed by performing dry etching using the pattern as an etching mask. By repeating the treatment on the substrate as described above, a semiconductor device can be obtained. The semiconductor device is, for example, a large scale integrated circuit (LSI).

Examples

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples.

<Preparation of Curable Compositions for Imprinting>

A polymerizable compound (A-1 to A-12, B-1 to B-7), a photopolymerization initiator (C-1 to C-4), and a release agent (D-1 to D-4) shown in Tables 2 to 8 below were mixed with each other. Further, 4-hydroxy-2,2,6,6-tetramethylpiperidine-1-oxyl free radical (manufactured by Tokyo Chemical Industry Co., Ltd.) was added as a polymerization inhibitor such that the content thereof 200 mass ppm (0.02 mass %) with respect to the content of all the polymerizable compounds. This mixture was filtered through a polytetrafluoroethylene (PTFE) filter having a pore size of 0.1 μm. As a result, a curable composition for imprinting was prepared. Tables 2 to 4 show a mass ratio between the respective components.

<Viscosity>

The viscosity of the curable composition for imprinting (before curing) was measured at 23±0.2° C. using a RE-80L type rotary viscometer (manufactured by Toki Sangyo Co., Ltd.). In addition, the viscosity of the polymerizable compound was measured at 25° C.±0.2° C.

The rotation speed during the measurement was as described below depending on the viscosity.

TABLE 1

| Viscosity | Appropriate Rotation Speed |
|---|---|
| 0.001 to 6.076 mPa · s | 100 rpm |
| 6.077 to 12.15 mPa · s | 50 rpm |
| 12.16 to 30.38 mPa · s | 20 rpm |
| 30.39 to 60.76 mPa · s | 10 rpm |
| 60.77 to 121.5 mPa · s | 5 rpm |
| 121.6 to 303.8 mPa · s | 2 rpm |
| 303.9 to 607.6 mPa · s | 1 rpm |
| 607.7 to 1215 mPa · s | 0.5 rpm |
| 1216 to 2025 mPa · s | 0.3 rpm |

<Ohnishi Parameter (Ohnishi P)>

The Ohnishi parameter of the curable composition for imprinting was measured as follows.

The Ohnishi parameters of the respective compounds were calculated based on the following expression, and a weight average thereof was obtained as the Ohnishi parameter of the curable composition.

Ohnishi Parameter=(Total Number of Atoms in Compound)/{(Number of Carbon Atoms in Compound)−(Number of Oxygen Atoms in Compound)}

<Pattern Formation>

As a quartz mold, a quartz mold having a line/space with a line width of 20 nm and a depth of 55 nm was used. Using an ink jet printer (DMP-2831, manufactured by Fujifilm Dimatix Inc.) as an ink jet device, the above-described curable composition for imprinting was applied to a silicon wafer (silicon substrate) using an ink jet method, and was interposed between the mold and the silicon wafer in a helium atmosphere. The curable composition for imprinting was exposed under a condition of 100 mJ/cm$^2$ from the quartz mold side using a high pressure mercury lamp, and then the quartz mold was released. As a result, a pattern was obtained.

<<Resolution Ability>>

The pattern obtained as described above was observed using a scanning electron microscope (SEM) at a magnification of 10000-fold.

A: The pattern was excellent over the entire surface
B: Pattern collapse was observed in a partial region
C: Pattern collapse was observed in a wide range
D: Pattern collapse was observed over the entire surface <<Etching Resistance>>

Using the pattern obtained as described above, reactive ion etching was performed using an etching device.

As the etching gas, $CHF_3/CF_4/Ar$ mixed gas was selected, and the sample was cooled to 20° C. during etching. The etching rate of the sample was about 50 nm/min.

An upper surface (side where the pattern was formed) of the sample was observed (magnification: 100000 fold) using a scanning electron microscope (SEM) before and after etching to check a disconnection state of the pattern.

A: Thinning and disconnection of the line were not observed over the entire surface
B: Thinning of the line was observed but disconnection of the line was not observed in a partial region
C: Disconnection of the line was observed in a partial region
D: Disconnection of the line was observed over the entire surface <<Releasability>>

During the pattern formation, a force (releasing force F; unit: N) required for releasing the quartz mold was measured.

The releasing force was measured using a method described in Comparative Example of Paragraphs "0102" to "0107 of JP2011-206977A.

A: F≤15 N
B: 15N<F≤18 N
C: 18N<F≤20 N
D: F>20 N

<Filling Properties>

As the quartz mold, a quartz mold having a concave pillar structure was used, the concave pillar structure having a circular shape with an opening radius of 1 μm and a depth of 2 μm. Using an ink jet printer (DMP-2831, manufactured by Fujifilm Dimatix Inc.) as an ink jet device, the above-described curable composition for imprinting was applied to a silicon wafer using an ink jet method, and was interposed between the mold and the silicon wafer in a helium atmosphere.

A state where the curable composition for imprinting was filled into the concave portion of the quartz mold was observed using a CCD camera, and the time required for the completion of the filling was measured.

A: Shorter than 3 seconds
B: 3 seconds or longer and shorter than 5 seconds
C: 5 seconds or longer and shorter than 10 seconds
D: 10 seconds or longer <Volatility>

Using an ink jet printer (DMP-2831, manufactured by Fujifilm Dimatix Inc.) as an ink jet device, the above-described curable composition for imprinting was applied to a silicon wafer (silicon substrate) using an ink jet method, and was left to stand in a helium atmosphere for 5 minutes. Next, the curable composition for imprinting was interposed between the silicon wafer and a quartz mold on which a pattern was not formed. The curable composition for imprinting was exposed under a condition of 100 mJ/cm$^2$ from the quartz mold side using a high pressure mercury lamp, and then the quartz mold was released. As a result, a cured film was obtained. Likewise, a cured sample obtained by leaving the curable composition for imprinting to stand in a helium atmosphere for 30 seconds was prepared, and a decrease ratio in film thickness thereof was obtained as an index for volatility. The film thickness was measured using an ellipsometer.

Decrease Ratio in Film Thickness={(Film Thickness of Sample after Standing for 30 Seconds)−(Film Thickness of Sample after Standing for 5 Minutes)}/(Film Thickness of Sample after Standing for 30 Seconds)

A: Lower than 10%
B: 10% or higher and lower than 20%
C: 20% or higher and lower than 50%
D: 50% or higher

TABLE 2

|  | Example 1 | Example 2 | Example 3 | Example 4 | Example 5 | Example 6 | Example 7 | Example 8 | Example 9 |
|---|---|---|---|---|---|---|---|---|---|
| A-1 | 10 | | | | | | | | |
| A-2 | | 20 | 10 | | 20 | | | | |
| A-3 | | | | 20 | | | | | |
| A-4 | | | | | | 20 | | | |
| A-5 | | | | | | | | 40 | 20 |
| A-6 | | | | | | | 20 | | |
| A-7 | 65 | 60 | 60 | | 50 | 55 | 50 | 40 | 40 |
| A-8 | | | | | | | | | |
| A-9 | | | | 60 | | | | | |
| A-10 | | | 15 | | 20 | | | | 20 |
| A-11 | | | | | | | 5 | | |
| A-12 | | | | | | | | | |
| B-1 | 25 | | | | | | 30 | | 20 |
| B-2 | | 20 | 15 | 10 | 10 | 20 | | 20 | |
| B-3 | | | | | | | | | |
| B-4 | | | | 10 | | | | | |
| B-5 | | | | | | | | | |
| B-6 | | | | | | | | | |
| B-7 | | | | | | | | | |
| C-1 | 2 | 2 | | | 2 | | 2 | 2 | |
| C-2 | | | 3 | 2 | | 2 | | | 2 |
| C-3 | | 2 | | | | 2 | | | |
| C-4 | | | | | | | | | |
| D-1 | | | | | | | | | |
| D-2 | 3 | | | | 3 | | 3 | | |
| D-3 | | 3 | | | | 3 | | | 3 |
| D-4 | | | | 3 | | | | 3 | |
| Viscosity | 8 | 7 | 8 | 14 | 7 | 8 | 6 | 20 | 15 |
| Ohnishi P | 3.5 | 3.6 | 3.6 | 3.9 | 3.8 | 3.6 | 3.8 | 3.3 | 3.5 |
| Resolution Ability | A | A | A | A | B | A | A | A | B |
| Etching Resistance | A | A | A | A | A | A | A | A | A |
| Filling Properties | A | A | A | B | A | A | A | B | B |
| Releasability | A | A | A | B | B | A | A | A | A |
| Volatility | A | A | A | A | A | A | B | A | A |

TABLE 3

| | Example 10 | Example 11 | Example 12 | Example 13 | Example 14 | Example 15 | Example 16 | Example 17 | Example 18 |
|---|---|---|---|---|---|---|---|---|---|
| A-1 | | | | | | | | 15 | 45 |
| A-2 | | | | | | | | | 80 |
| A-3 | 40 | | | | | | | | |
| A-4 | | 20 | | | | 40 | | | |
| A-5 | | | 20 | 80 | | | | | |
| A-6 | | | | | 80 | | | | |
| A-7 | | 60 | | | | | 10 | 30 | |
| A-8 | | | 60 | | | | | | |
| A-9 | 40 | | | | | | | 35 | |
| A-10 | | 10 | | | | | | | |
| A-11 | | | | | | | 30 | | |
| A-12 | | | | | | 30 | | | |
| B-1 | | | 20 | | | | | 20 | |
| B-2 | | 10 | | | | | | | 20 |
| B-3 | 10 | | | | | | | | |
| B-4 | 10 | | | 15 | | 20 | | | |
| B-5 | | | | 5 | | | | | |
| B-6 | | | | | 20 | | 25 | | |
| B-7 | | | | | | | | | |
| C-1 | | 2 | 2 | 4 | | | | 1 | 2 |
| C-2 | 2 | | | | 2 | 2 | 2 | 1 | |
| C-3 | | | | | | | | 1 | 2 |
| C-4 | | | | | | | | | |
| D-1 | | | 3 | 3 | | 3 | | 3 | |
| D-2 | 3 | 3 | | | | | 3 | | |
| D-3 | | | | | | | | | 3 |
| D-4 | | | | | 3 | | | | |
| Viscosity | 11 | 7 | >100 | 20 | <5 | 10 | 8 | 7 | 5 |
| Ohnishi P | 3.9 | 3.6 | 3.4 | 3.1 | 4.9 | 3.8 | 3.6 | 4.3 | 4.5 |
| Resolution Ability | A | A | A | A | A | B | B | A | A |
| Etching Resistance | A | A | A | A | C | A | A | C | C |
| Filling Properties | B | A | C | B | A | B | A | A | A |
| Releasability | B | B | A | B | B | B | B | B | A |
| Volatility | A | A | A | A | C | A | A | B | C |

TABLE 4

| | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 | Comparative Example 11 |
|---|---|---|---|---|---|---|---|---|---|---|---|
| A-1 | | | | 20 | | | | | | | |
| A-2 | | | | | | | | | | | |
| A-3 | | | | | | | | | | | |
| A-4 | | | | | | | | | | | |
| A-5 | | | | | | | | | 50 | | |
| A-6 | | | | | | | | | | 25 | 18 |
| A-7 | 50 | | 75 | | | 70 | | | | 25 | |
| A-8 | | | | | | | | | | | |
| A-9 | | | | 75 | 40 | | | | | | |
| A-10 | 30 | 80 | 25 | | | | | | | | |
| A-11 | | | | | 40 | | 70 | | | | |
| A-12 | | | | | | | | 80 | | | |
| B-1 | | | | 25 | | | | | | | |
| B-2 | 20 | | | | | 30 | | | | | |
| B-3 | | 20 | | | | | | 20 | | | |
| B-4 | | | | | | | | | 50 | | |
| B-5 | | | | | | | | 30 | | | 37 |
| B-6 | | | | | | | | | | 50 | |
| B-7 | | | | | | | | | | | 42 |
| C-1 | | | | | | | | | | | |
| C-2 | | | | | | | | | 3 | | |
| C-3 | | | | | | | | | | | 3 |
| C-4 | | | | | | | | | | 3 | |
| D-1 | | | | 3 | | 3 | | | | | 1 |
| D-2 | | 3 | 3 | | 3 | | | | | 3 | |
| D-3 | 3 | | | | | | | 3 | | | |
| D-4 | | | | | | | | | 0.8 | | |
| Viscosity | 7 | 5 | 10 | 12 | 11 | 10 | 6 | 13 | 18 | 9 | 10 |
| Ohnishi P | 3.6 | 4.1 | 3.5 | 3.9 | 4.4 | 3.3 | 4 | 3.6 | 3 | 3.3 | — |

TABLE 4-continued

| | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 | Comparative Example 11 |
|---|---|---|---|---|---|---|---|---|---|---|---|
| Resolution Ability | C | D | A | C | C | D | D | D | D | D | D |
| Etching Resistance | — | — | A | — | — | — | — | — | — | — | — |
| Filling Properties | A | A | B | C | C | C | A | C | C | B | C |
| Releasability | A | B | D | B | C | A | C | A | B | D | B |
| Volatility | B | B | B | C | B | A | D | A | C | B | C |

TABLE 5

| | Structure | Boiling Point (°C.) | Ohnishi P | Viscosity @ 25° C. |
|---|---|---|---|---|
| A-1 | | 242 | 5 | 3.3 |
| A-2 | | >260 | 4.7 | 3.9 |
| A-3 | | >260 | 4.3 | 5.1 |
| A-4 | | >260 | 4.4 | 4.8 |
| A-5 | | >260 | 3.2 | 25.6 |
| A-6 | | 219 | 5.5 | 1.4 |

TABLE 5-continued
| | | Boiling Point (° C.) | Ohnishi P | Viscosity @ 25° C. |
|---|---|---|---|---|
| A-7 | 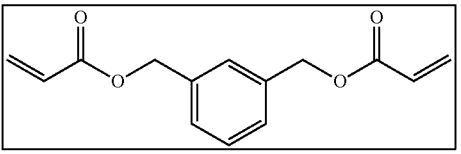 [SMILES: C=CC(=O)OCc1cccc(COC(=O)C=C)c1] | >260 | 3.2 | 9.7 |
| A-8 | 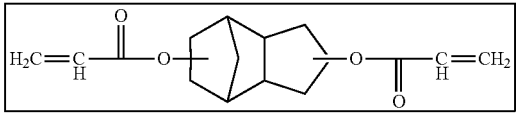 | >260 | 3.3 | 120 |
| A-9 | 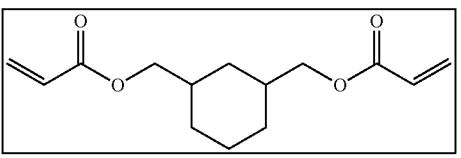 [SMILES: C=CC(=O)OCC1CCCC(COC(=O)C=C)C1] | >260 | 4 | 17.1 |
| A-10 | 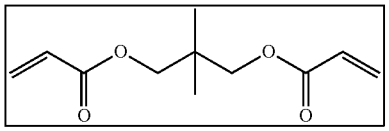 | 285 | 4.4 | 4.5 |
| A-11 | 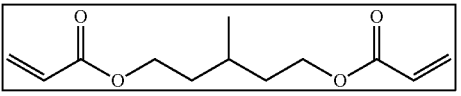 [SMILES: C=CC(=O)OCCC(C)CCOC(=O)C=C] | >260 | 4.3 | 4.6 |
| A-12 | 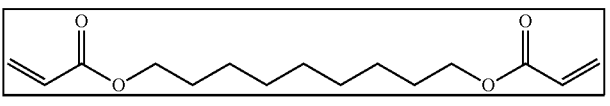 [SMILES: C=CC(=O)OCCCCCCCCCOC(=O)C=C] | >260 | 3.8 | 9.3 |
TABLE 6
| | | Ohnishi P |
|---|---|---|
| B-1 | 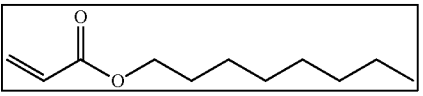 | 3.7 |
| B-2 | 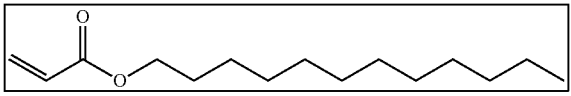 [SMILES: C=CC(=O)OCCCCCCCCCCCC] | 3.5 |
| B-3 | 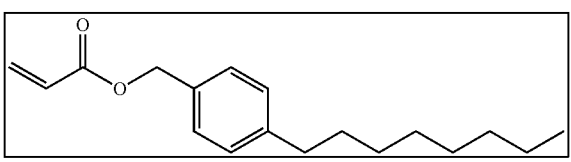 [SMILES: C=CC(=O)OCc1ccc(CCCCCCCC)cc1] | 2.9 |
| B-4 | 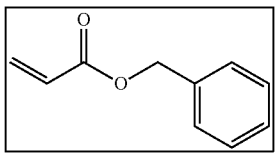 | 2.8 |

TABLE 6-continued

| | | Ohnishi P |
|---|---|---|
| B-5 | 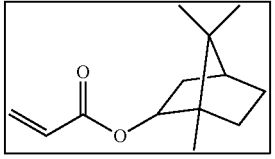 | 3.2 |
| B-6 | 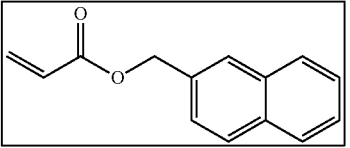 [SMILES: C=CC(=O)OCc1ccc2ccccc2c1] | 2.3 |
| B-7 | 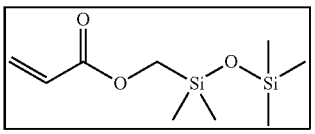 | — |

TABLE 7

| C-1 | 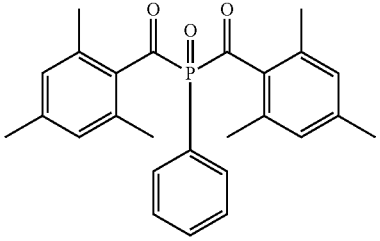 |
|---|---|
| C-2 | 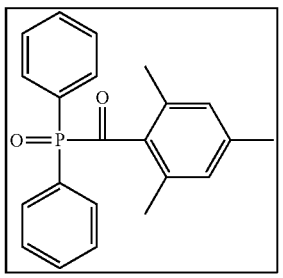 [SMILES: Cc1cc(C)c(C(=O)P(=O)(c2ccccc2)c2ccccc2)c(C)c1] |
| C-3 | 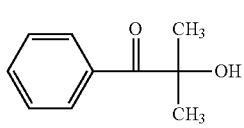 |
| C-4 | 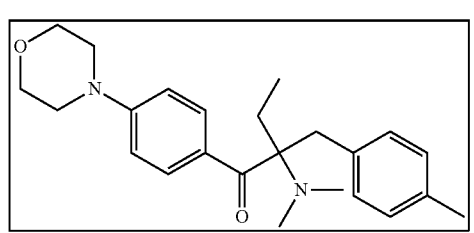 [SMILES: CCC(Cc1ccc(C)cc1)(C(=O)c1ccc(N2CCOCC2)cc1)N(C)C] |

TABLE 8

| D-1 | Fluorine-Containing Surfactant having PEO Structure ZONYL FSO-100 |
|---|---|
| D-2 | 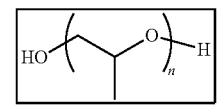 |
| D-3 | 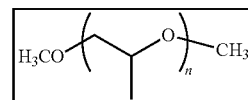 |
| D-4 | 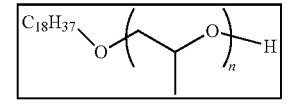 |

In D-2, n represents 5 to 15. In D-3, n represents 5 to 15. In D-4, n represents 5 to 15.

As can be seen from the tables above, it was found that the curable composition for imprinting according to the embodiment of the present invention has excellent resolution ability, filling properties, and releasability. Further, it was found that the curable composition for imprinting according to the embodiment of the present invention has low viscosity and excellent etching resistance and is not likely to be volatilized.

What is claimed is:

1. A curable composition for imprinting comprising:
a monofunctional polymerizable compound;
a bifunctional polymerizable compound; and
a photopolymerization initiator,
wherein the content of the monofunctional polymerizable compound is 5 to 30 mass % with respect to the content of all the polymerizable compounds included in the curable composition for imprinting,
the content of the bifunctional polymerizable compound is 70 mass % or higher with respect to the content of all the polymerizable compounds included in the curable composition for imprinting, at least one bifunctional polymerizable compound is a bifunctional polymerizable compound in which the number of atoms linking two polymerizable groups to each other is 2 or less, at least one bifunctional polymerizable compound is a bifunctional polymerizable compound that includes two polymerizable groups having an ethylenically unsaturated bond and in which the number of atoms linking the ethylenically unsaturated bonds to each other is 6 or less, the content of a bifunctional polymerizable compound that does not include an alicyclic structure and an aromatic ring structure and in which the number of atoms linking two polymerizable groups to each other is 3 or more is 30 mass % or lower with respect to the content of all the polymerizable compounds included in the curable composition for imprinting, and the bifunctional polymerizable compound in which the number of atoms linking two polymerizable groups to each other is 2 or less and the bifunctional polymerizable compound that includes two polymerizable groups having an ethylenically unsaturated bond and in which the number of atoms linking the ethylenically unsaturated bonds to each other is 6 or less have a boiling point of 230° C. or higher at 101325 Pa.

2. The curable composition for imprinting according to claim 1,
wherein the polymerizable groups included in the bifunctional polymerizable compound are each independently a (meth)acryloyloxy group.

3. The curable composition for imprinting according to claim 1,
wherein 40 mass % or higher of all the polymerizable compounds included in the curable composition for imprinting are formed of a bifunctional polymerizable compound that has at least one of an alicyclic structure or an aromatic ring structure.

4. The curable composition for imprinting according to claim 1,
wherein the bifunctional polymerizable compound that does not include an alicyclic structure and an aromatic ring structure and in which the number of atoms linking two polymerizable groups to each other is 3 or more has a viscosity of 50 mPa·s or lower at 25° C.

5. The curable composition for imprinting according to claim 1,
wherein the bifunctional polymerizable compound that does not include an alicyclic structure and an aromatic ring structure and in which the number of atoms linking two polymerizable groups to each other is 3 or more is a (meth)acrylate.

6. The curable composition for imprinting according to claim 1,
wherein the total content of the bifunctional polymerizable compound in which the number of atoms linking two polymerizable groups to each other is 2 or less and the bifunctional polymerizable compound that includes two polymerizable groups having an ethylenically unsaturated bond and in which the number of atoms linking the ethylenically unsaturated bonds to each other is 6 or less is 1 to 80 mass % with respect to the content of all the polymerizable compounds included in the curable composition for imprinting.

7. The curable composition for imprinting according to claim 1,
wherein the monofunctional polymerizable compound is a (meth)acrylate.

8. The curable composition for imprinting according to claim 1,
wherein the Ohnishi parameter of the curable composition for imprinting is 4.0 or lower.

9. The curable composition for imprinting according to claim 1,
wherein the viscosity of the curable composition for imprinting at 23° C. is 8 mPa·s or lower.

10. The curable composition for imprinting according to claim 1,
wherein at least one monofunctional polymerizable compound includes at least one group selected from the group consisting of:
a group, in which the total number of carbon atoms is 8 or more, that includes at least one of an alkyl chain and an alkenyl chain and at least one of an alicyclic structure and an aromatic ring structure;
a group that includes an alkyl chain having 4 or more carbon atoms; and
a group that includes an alkenyl chain having 4 or more carbon atoms.

11. The curable composition for imprinting according to claim 10,
wherein the alkyl chain and the alkenyl chain are each independently linear or branched.

12. The curable composition for imprinting according to claim 1,
wherein the content of a trifunctional or higher polymerizable compound is 3 mass % or lower with respect to the content of all the polymerizable compounds included in the curable composition for imprinting.

13. The curable composition for imprinting according to claim 1, further comprising:
a release agent.

14. A cured product which is formed by curing the curable composition for imprinting according to claim 1.

15. The cured product according to claim 14, which is provided on a silicon substrate.

16. A pattern forming method comprising:
applying the curable composition for imprinting according to claim 1 to a substrate or a mold; and
irradiating the curable composition for imprinting with light in a state where the curable composition for imprinting is interposed between the mold and the substrate.

17. The pattern forming method according to claim 16, wherein a size of the pattern is 20 nm or less.

18. A lithography method comprising:
performing etching by using a pattern obtained via the pattern forming method according to claim 16 as a mask.

* * * * *